(12) United States Patent
Rasekh et al.

(10) Patent No.: US 10,663,933 B2
(45) Date of Patent: May 26, 2020

(54) SYSTEMS AND METHODS FOR SUBNETWORK HYDRAULIC MODELING

(71) Applicant: Sensus Spectrum LLC, Raleigh, NC (US)

(72) Inventors: Amin Rasekh, Atlanta, GA (US); Zachary A. Barker, Durham, NC (US); Michael Ehsan Shafiee, Raleigh, NC (US); Travis Smith, Raleigh, NC (US)

(73) Assignee: Sensus Spectrum LLC, Raleigh, NC (US)

(*) Notice: Subject to any disclaimer, the term of this patent is extended or adjusted under 35 U.S.C. 154(b) by 301 days.

(21) Appl. No.: 15/584,813

(22) Filed: May 2, 2017

(65) Prior Publication Data

US 2018/0196399 A1    Jul. 12, 2018

Related U.S. Application Data

(63) Continuation-in-part of application No. 15/402,743, filed on Jan. 10, 2017.

(51) Int. Cl.
*G01F 17/00*    (2006.01)
*G05B 13/04*    (2006.01)
(Continued)

(52) U.S. Cl.
CPC .......... *G05B 13/042* (2013.01); *E21B 49/088* (2013.01); *G01M 3/2815* (2013.01);
(Continued)

(58) Field of Classification Search
None
See application file for complete search history.

(56) References Cited

U.S. PATENT DOCUMENTS

| 4,308,746 | A | | 1/1982 | Covington |
| 5,272,646 | A | * | 12/1993 | Farmer ............... G01M 3/2815 |
| | | | | 340/605 |

(Continued)

FOREIGN PATENT DOCUMENTS

CN    105674058    6/2016

OTHER PUBLICATIONS

International Search Report and Written Opinion for International Patent Application No. PCT/US2017/052135 dated Dec. 5, 2017.
(Continued)

*Primary Examiner* — Aditya S Bhat
(74) *Attorney, Agent, or Firm* — Andrus Intellectual Property Law, LLP

(57) ABSTRACT

A system for managing a distribution network, the system including a network hydraulic model and an automated meter infrastructure (AMI) providing AMI data from consumption meters. The system includes subnetworks within the distribution network, nodes interconnecting the subnetworks, and boundary devices connected to the nodes. Each boundary device includes a flow meter and a pressure sensor that sense a flow and a pressure of the distribution network at the nodes at a given time step. A subnetwork hydraulic model is generated for each subnetwork from the network hydraulic model. A processing module determines a first comparison for the given time interval between the AMI data from the consumption meters within a given subnetwork, the flow and the pressure at the nodes bordering the given subnetwork, and the subnetwork hydraulic model for the given subnetwork. The distribution network is managed based at least in part on the first comparison.

20 Claims, 6 Drawing Sheets

(51) Int. Cl.
G06Q 10/06 (2012.01)
E21B 49/08 (2006.01)
G01M 3/28 (2006.01)
G06F 30/20 (2020.01)
G05B 17/02 (2006.01)
G06Q 50/06 (2012.01)
G06F 17/10 (2006.01)
E21B 43/00 (2006.01)

(52) U.S. Cl.
CPC .......... *G05B 13/048* (2013.01); *G06F 30/20* (2020.01); *G06Q 10/06393* (2013.01); *E21B 43/00* (2013.01); *G05B 17/02* (2013.01); *G06F 17/10* (2013.01); *G06Q 50/06* (2013.01)

(56) References Cited

U.S. PATENT DOCUMENTS

| | | | |
|---|---|---|---|
| 5,625,150 | A | 4/1997 | Greene et al. |
| 8,479,566 | B2 | 7/2013 | Hasseloh et al. |
| 8,820,143 | B2 | 9/2014 | Sarma et al. |
| 9,335,233 | B2 | 5/2016 | Khalifa et al. |
| 9,366,596 | B2 | 6/2016 | Mekid et al. |
| 9,558,453 | B1 * | 1/2017 | Chaudhary ............ G06N 7/005 |
| 2011/0290331 | A1 | 12/2011 | Burrows |
| 2014/0149054 | A1 * | 5/2014 | Hanss ................ E03B 7/003 702/35 |
| 2014/0255216 | A1 * | 9/2014 | Kallesoe ................ E03B 7/075 417/53 |

OTHER PUBLICATIONS

Salgado et al. Extending the gradient method to include pressure regulating valves in pipe networks. Computer Applications in Water Supply, 1, 1988.

Todini et al. Computer applications in water supply: vol. 1—systems analysis and simulation. chapter A gradient algorithm for the analysis of pipe networks, pp. 1-20. Research Studies Press Ltd., Taunton, UK, UK, 1988. ISBN 0-471-91783-4.

Unpublished U.S. Appl. No. 15/226,597, filed Aug. 2, 2016.

Shamir et al, An analytic approach to scheduling pipe replacement, Journal of American Water Works Association, May 1979, 248-258.

Puust et al, A review of methods for leakage management in pipe networks, Urban Water Journal, 2010, 25-45, 7:1.

Kettler et al. An analysis of pipe breakage in urban water distribution networks, Can. J. Civ. Eng., 1985, 286-293, 12.

Perelman et al. Automated sub-zoning of water distribution systems, Environmental Modelling & Software, 2015, 1-14, 65.

Chambers et al. Safe piped water: managing microbial water quality in piped distribution. Chapter 3: Design and operation of distribution networks, World Health Organization, 2004, 38-68.

Massolani et al. Estimating leakages in water distribution networks based only on inlet flow data, J. Water Resour. Plann. Manage., 2017.

Filion et al. Extended-period analysis with a transient model. Journal of Hydraulic Engineering, Jun. 2002, 616-624, 128.

Eliades et al. Leakage fault detection in district metered areas of water distribution systems, Journal of Hydroinformatics, 2012, 992-1005, 14.4.

Kapelan et al. Multiobjection sampling design for water distribution model calibration, J. Water Resour. Plann. Manage., 2003, 466-479, 129.

Paola et al. Optimal design of district metered areas in water distribution networks, Procedia Engineering, 2014, 449-457, 70.

Shafiee et al. Parallel evlutionary algorithm for designing water distribution networks to minimize background leakage, J. Water Resour. Plann. Manage., 2015.

Wu et al. Pressure-dependent leak detection model and its application to a district water system, Journal of Water Resources Planning and Management, Jan./Feb. 2010, 116-128, 136(1).

Ahmed, Application of the gradient method for the analysis of unsteady flow in water networks, The University of Arizona, 1997 1-188.

Walski et al. Advanced water distribution modeling and management, Haestad Methods, Inc. 2003.

Giustolisi et al. Water distribution network pressure-driven analysis using the enhanced global gradient algorithm, J. Water Resour. Plann. Manage., Nov./Dec. 2011, 498-510, 137(6).

* cited by examiner

SYSTEMS AND METHODS FOR SUBNETWORK HYDRAULIC MODELING

CROSS REFERENCE TO RELATED APPLICATIONS

This application is a continuation-in-part of U.S. patent application Ser. No. 15/402,743, filed Jan. 10, 2017, which is incorporated herein by reference in its entirety.

FIELD

The present disclosure generally relates to hydraulic modeling, and more particularly to hydraulic modeling for subnetworks of a water distribution system.

BACKGROUND

The Background and Summary are provided to introduce a foundation and selection of concepts that are further described below in the Detailed Description. The Background and Summary are not intended to identify key or essential features of the claimed subject matter, nor are they intended to be used as an aid in limiting the scope of the claimed subject matter.

The following U.S. Patents and Patent Applications are incorporated herein by reference:

U.S. patent application Ser. No. 15/226,597 discloses an improved hydraulic model using real-time or near-real-time data from an Automated or Advanced Metering Infrastructure (AMI), which includes consumer consumption meters, to improve model accuracy, particularly by obtaining more accurate, higher-resolution water demand values for service nodes in the model. Improving the accuracy of water demand calculation for the service nodes in the model stems from an improved technique that more accurately determines which consumption points in the water distribution system should be associated with each service node and from the use of real-time or near-real-time consumption data. The computer apparatus uses the water demand values to improve the accuracy and resolution of its water flow and pressure estimates. In turn, the improved flow and pressure estimation provides for more accurate control, e.g., pumping or valve control, flushing control or scheduling, leak detection, step testing, etc.

U.S. patent application Ser. No. 15/402,743 discloses a method, apparatus, and system for leak detection in a distribution network having consumption meters. The distribution network is divided into zones having an upstream location and a downstream location. An upstream pressure sensor detects the upstream pressure at the upstream location and the downstream pressure sensor detects the detected downstream pressure at the downstream location. A downstream pressure lookup table is used to determine an expected pressure at each downstream location based on a range of hypothetical upstream pressures at the corresponding upstream location and consumption data from the consumption meters. The expected pressure and the detected downstream pressure at each downstream location are compared to determine if the calculated discrepancy exceeds a discrepancy threshold. If a discrepancy exceeds a discrepancy threshold, a leak location lookup table containing a set of potential leak locations based on a range of hypothetical discrepancies is used to determine a set of probable leak locations.

SUMMARY

One embodiment of the present disclosure relates to a system for managing a distribution network, the system including a network hydraulic model and an automated meter infrastructure (AMI) that provides an AMI data from a plurality of consumption meters. The system comprises a plurality of subnetworks within the distribution network, a plurality of nodes that interconnect the plurality of subnetworks, and a plurality of boundary devices each being operatively connected to a node from the plurality of nodes. Each boundary device from the plurality of boundary devices at least includes a flow meter and a pressure sensor. The flow meter senses a flow and the pressure sensor senses a pressure of the distribution network at the plurality of nodes at a given time step. A plurality of subnetwork hydraulic models is generated from the network hydraulic model, wherein the plurality of subnetwork hydraulic models correspond to the plurality of subnetworks. A processing module is configured to determine a first comparison for the given time interval the AMI data from the plurality of consumption meters within a given subnetwork, the flow and the pressure at the plurality of nodes that border the given subnetwork, and the subnetwork hydraulic model for the given subnetwork. The distribution network is managed based at least in part on the first comparison.

In one embodiment, a method for managing a distribution network includes incorporating a network hydraulic model and an automated meter infrastructure (AMI) that provides an AMI data from a plurality of consumption meters. The method comprises dividing the distribution network into a plurality of subnetworks, interconnecting the plurality of subnetworks at a plurality of nodes, and providing a plurality of boundary devices that each at least include a flow meter and a pressure sensor. Each flow meter is configured to sense a flow and each pressure sensor is configured to sense a pressure of the distribution network at the plurality of nodes. Each boundary device is operatively connecting to a node from the plurality of nodes. The method includes generating from the network hydraulic model a plurality of subnetwork hydraulic models that correspond to the plurality of subnetworks. The method includes sensing at a given time step by the plurality of boundary devices the flow and the pressure of the distribution network at each node of the plurality of nodes, wherein an interval is formed between times at the given time step. The method includes determining a comparison for the interval between the AMI data from the plurality of consumption meters within a given subnetwork, the flow and the pressure sensed at the plurality of nodes that border the given subnetwork, and the subnetwork hydraulic model for the given subnetwork. The distribution network is managed based at least in part on the comparison.

One embodiment relates to a system for managing a distribution network, the system incorporating a network hydraulic model and an automated meter infrastructure (AMI) that provides an AMI data from a plurality of consumption meters. The system comprises a first subnetwork within the distribution network, a second subnetwork within the distribution network, a node that operatively connects the first subnetwork and the second subnetwork, and a boundary device that is operatively connected to the node. The boundary device includes a flow meter that senses a flow and a pressure sensor that senses a pressure of the distribution network at the node. A first subnetwork hydraulic model corresponding to the first subnetwork. A second subnetwork hydraulic model corresponding to the second subnetwork. A processing module is configured to compare at least the AMI data from the plurality of consumption meters within the first subnetwork, the flow and the pressure sensed at the node, and the first subnetwork hydraulic model to identify an anomaly between the first subnetwork hydraulic model and the AMI data from the plurality of consumption meters, the flow sensed at the node, and/or the pressure sensed at the node.

Various other features, objects and advantages of the disclosure will be made apparent from the following description taken together with the drawings.

BRIEF DESCRIPTION OF THE DRAWINGS

The drawings illustrate the best mode presently contemplated of carrying out the disclosure. The same numbers are used throughout the drawings to reference like features and like components. In the drawings.

DETAILED DISCLOSURE

This written description uses examples to disclose embodiments of the disclosed invention, including the best mode, and also to enable any person skilled in the art to practice or make and use the same. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The control and management of water distribution networks are important tasks for water utilities. This encompasses many operations, such as flushing, leak detection, power management, and contamination source identification. One of the approaches utilities have used is setting up District Metered Areas (DMAs) for improving the management and performance of the water network. For example, one DMA can be implemented so that unidirectional hydrant flushing can be performed. This flushing is designed to isolate the DMA using a set of valves, then opening a set of hydrants. The concept of a District Metered Area is to limit or segment off a part of network (one DMA) to measure the amount of water inflow or outflow to or from the subarea, or subnetwork. In this manner, the water utility can pinpoint issues within the water distribution network to a single subnetwork.

Figure 1:
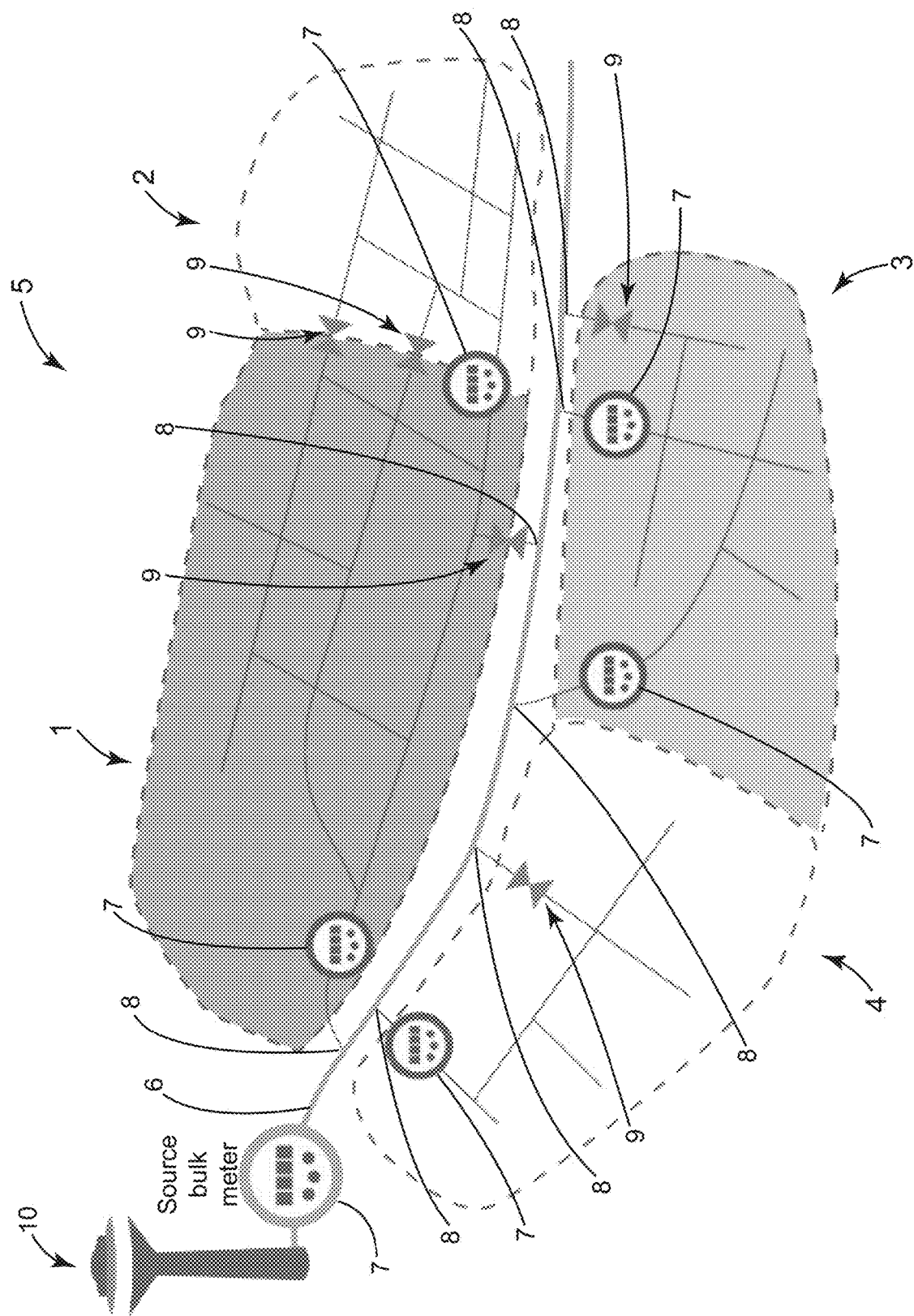
FIG. 1 is an overhead representation of a typical water distribution network known in the art.

However, this concept fails if the flow of water in or out of a subnetwork is uncertain. FIG. 1 shows the typical practice of setting up subnetworks 1-4 to find leaks and flush the distribution network 5. The present inventors have identified that this practice is labor intensive and requires substantial human involvement to manipulate the hydraulics of the subnetwork for analysis. To test a subnetwork under this practice, a utility crew must close some of the valves within the subnetwork to ensure that the subarea of interest is confined. This includes selectively closing boundary valves 9 at one or more nodes 8 that interconnect the subnetworks 1-4 and distribution pipes 6. However, the current practice cannot guarantee that the resulting simulation data received from DMA bulk meters 7 reflects the actual network without placing human operators in the field. Specifically, there is no practical mechanism to confirm that a valve is either closed or open without physically checking the valve condition at its location. Due to limited accessibility to the distribution network 5, the confinement of the subarea is always questionable.

Among other things, the presently disclosed systems and methods overcome the burdens that utilities face while setting up District Metering Areas. In accordance with the present disclosure, a water utility may control or manage a subnetwork with regard to leak detection, hydrant flushing scheduling, water quality analysis, contamination source identification, power management, pressure management, and more.

Figure 2:
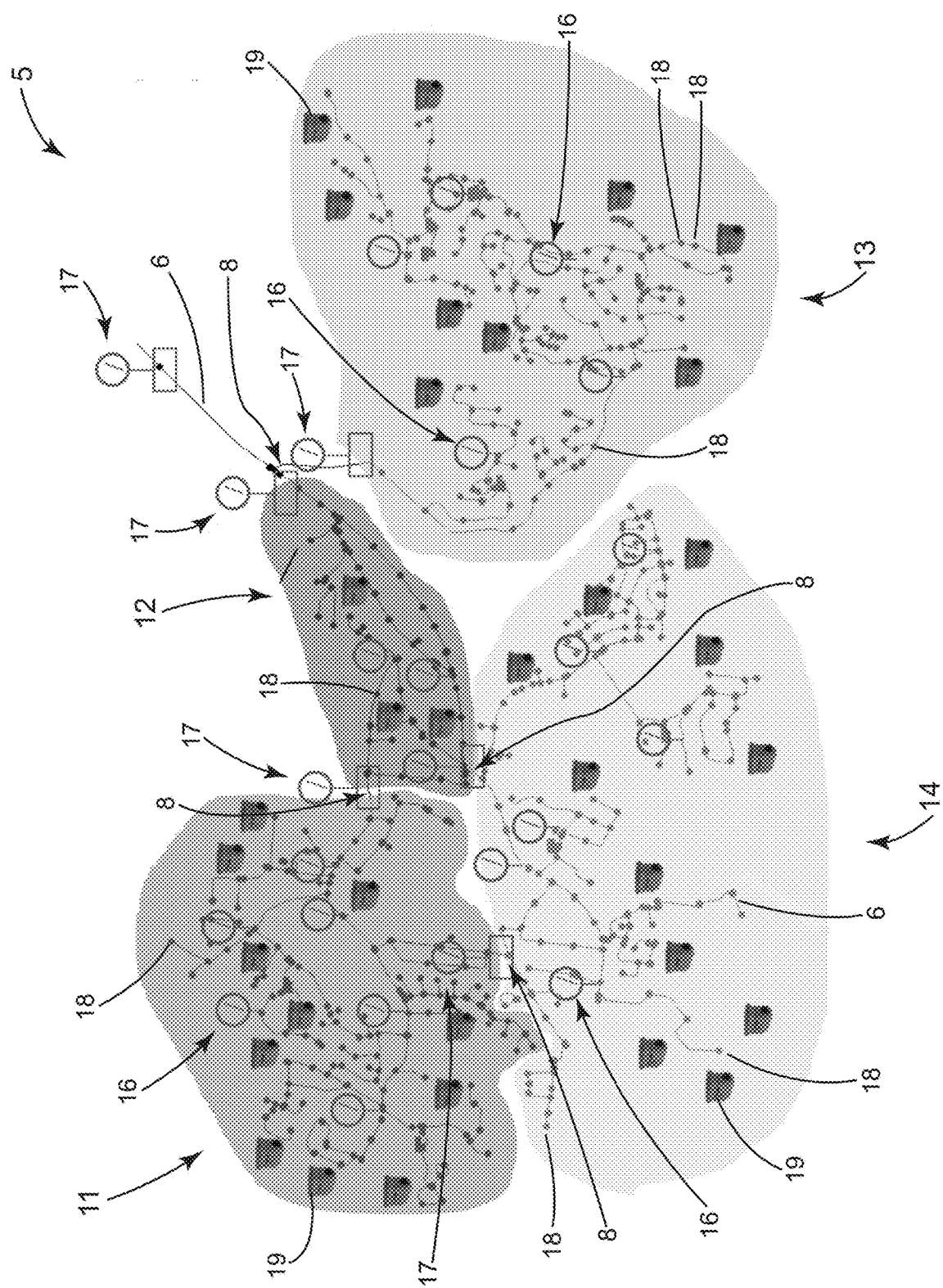
FIG. 2 is an overhead representation of a water distribution network in accordance with the systems and methods of the present disclosure.

FIG. 2 shows one embodiment of a distribution network 5 in accordance with the present disclosure. The distribution network 5 is divided into 4 sections, subnetworks 11-14. Water is carried through the distribution network 5 through a series of distribution pipes 6 and the subnetworks 11-14 are interconnected at least one node 8. FIG. 2 further discloses the incorporation of pressure sensors 16 in various locations throughout the distribution network 5, as well as ally meters 19 (which can also be water meters with mounted pressure sensors) and consumption meters 18. A series of Boundary Devices 17 are also shown, which are shown as bundled devices that include at least a flow meter 42 and a pressure sensor 44 (shown in FIG. 3). In certain embodiments, the flow meters are Sensus C&I and Genesis meters and also include a magnet, insertion, and any type of devices that can sample water flow at a specific pipe. Although additional Boundary Devices 17 may be distributed throughout the distribution network 5, the present embodiment has Boundary Devices 17 operatively connected to each node 8. In this configuration, the Boundary Devices 17, through the flow meter 42 and pressure sensor 44 contained therein, sense the flow and the pressure of the water within the distribution network 5 at each node 8. It should be noted that subnetworks 11-14 may be interconnected by any number of nodes 8, at varying locations, and with varying configurations.

Figure 3:
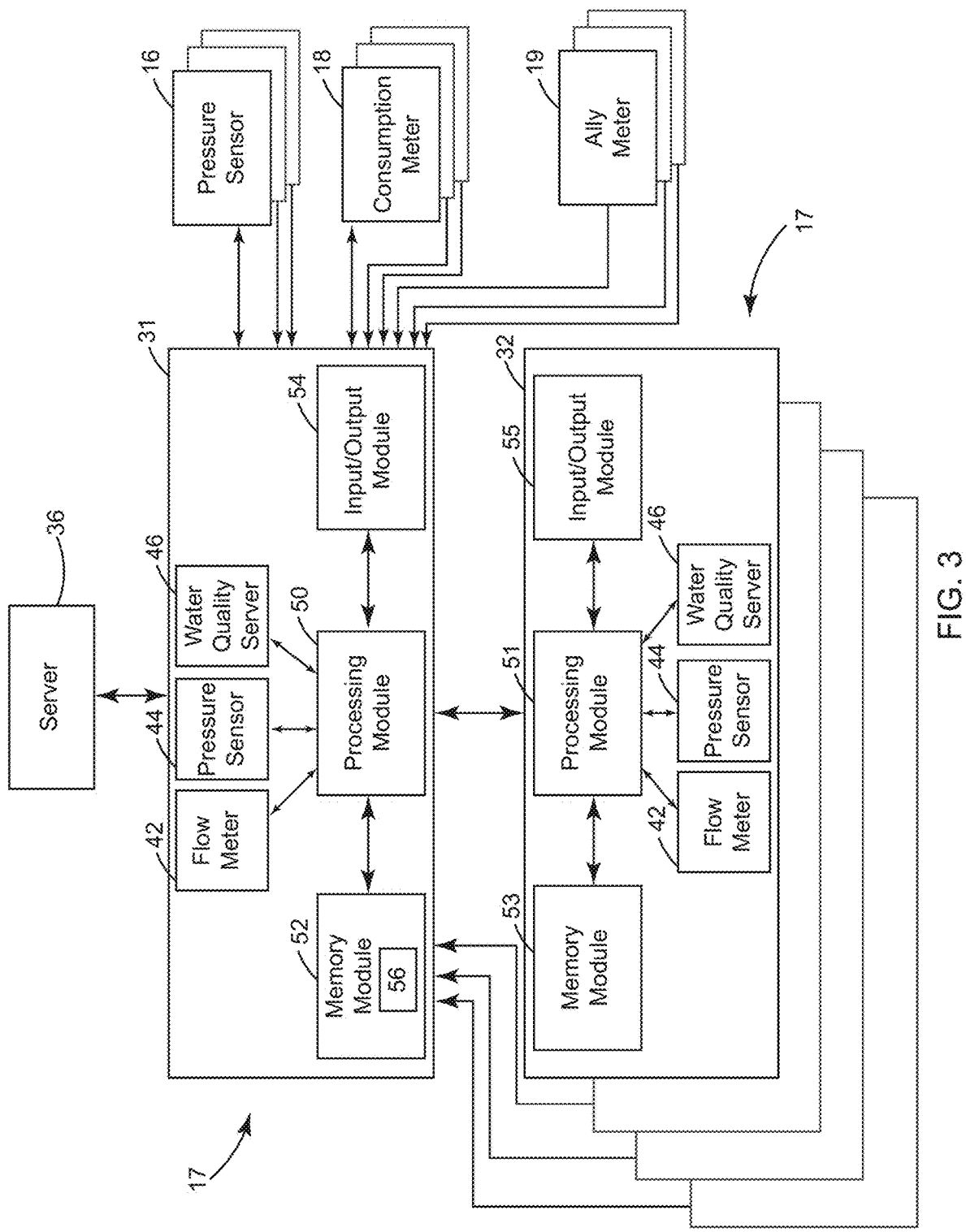
FIG. 3 is a schematic view of one embodiment of the systems and methods of the present disclosure.

FIG. 3 shows one embodiment of the Boundary Devices 17 and the flow of communication to, from, and between them in operation. In this embodiment, the Boundary Devices 17 are each designated as either a Master Device 31 or a Slave Device 32. In addition to the flow meter 42, pressure sensor 44, and an optional water quality sensor 46, the Master Device 31 includes a memory module 52 that stores a subnetwork hydraulic model 56 therein. The Master Device 31 further includes a processing module 50 and an input/output module 54. In some embodiments, the Master Device works independently if the layout of subnetwork allows separation of the subnetwork by only one device, such as Subnetwork 13 in FIG. 2. When a subnetwork is defined using several device, the Master Device 31 communicates with at least one Slave Device 32, in this example, four Slave Devices 32 in the schematic of FIG. 3. In the embodiment shown, each Slave Device 32 has a memory module 53, a processing module 51, and an input/output module 55. These are in addition to the flow meter 42, pressure sensor 44, and water quality sensor 46 previously introduced. In embodiments utilizing the Master Device 31 for the storage and simulation of the subnetwork hydraulic model 56, the memory module 53, processing module 51, and input/output module 55 of the Slave Device 32 may have less capacity or performance capability than the corresponding memory module 52, processing 50 and input/output module 54 of the Master Device 31. In this regard, costs can be saved by limiting Slave Devices 32 to sensing and communicating to a Master Device 31.

The Master Device 31 is also shown to communicate with a Server 36, which is discussed further below. Likewise, the Master Device 31 is shown to communicate with a series of pressure sensors 16, consumption meters 18, and ally meters 19, depending on the presence of these components within a particular subnetwork.

While the schematic view provided by FIG. 3 depicts lines for potential communication between the components described, these are merely exemplary and do not indicate required communication pathways, or literal connections of hardware.

Returning to FIG. 2, each subnetwork 11-14 is a portion of a distribution network 5 that is defined within a perimeter. Any water component that lies inside of this subnetwork area belongs to the subnetwork. Examples of water components include tanks, valves, pumps, meters, and other devices. These subnetworks may also contain or communicate with existing Sensus devices, such as Gateways, Remote Telemetry Module (RTM), ally, and the family of iPerl. Also, these subnetworks 11-14 may also contain or communicate with devices that are designed to sample pressure and water flow rate from distribution pipes 6. The sensing devices in each subnetwork 11-14 may include water level sensors in tanks and pump control devices such as Programmable Logic Controllers. The Master Device 31 collects data that is transmitted from sensors and devices that are physically located in the boundary of the corresponding subnetwork 11-14 or another network.

In the embodiment shown in FIG. 3, the distribution network 5 has a corresponding network hydraulic model that is configured and run as provided in U.S. patent application Ser. No. 15/226,579. A subnetwork hydraulic model 56 is derived from the network hydraulic model and stored within one of the Boundary Devices 17 for each of the corresponding subnetworks 11-14. In this embodiment, one of the Boundary Devices 17 is designated as a Master Device 31 and enabled with computational power, either as a chipset or as a connected computer station with power. The Master Device 31 simulates the characteristics of the distribution network 5 within the given subnetwork, in the field, using the associated subnetwork hydraulic model 56 associated with that given subnetwork. Likewise, other Boundary Devices 17 are each designated as a Slave Device 32 and communicate the flow and pressure sensed by the Slave Device 32 at a node 8 to the Master Device 31 to perform the simulation computations. The Master Device 31 may operate to perform various applications and control for the associated subnetwork, such as flushing, leak detection, and step-test performance checks described above and in U.S. patent application Ser. Nos. 15/226,597 and 15/402,743.

In the field, the Master Device 31 may operate alone, or may communicate with at least one Slave Device 32 based on the layout of the distribution network 5 and the configuration of the subnetworks with respect to each other. For example, FIG. 4 discloses four subnetworks, subnetwork 11-14, and five Boundary Devices 17. The Boundary Devices 17 are each configured as a Master Device 31, a Slave Device 32, or both, depending on the subnetwork in question. In the embodiment shown, Boundary Device 26 is a Master Device 31 for subnetwork 11, while also being a Slave Device 32 for subnetwork 12. Boundary Device 30 is also a Slave Device 32 for subnetwork 12. Boundary Device 28 serves as the Master Device 31 for both subnetwork 12 and subnetwork 14. Boundary Device 27 is a Slave Device 32 for both subnetwork 11 and subnetwork 14. Other Boundary Devices 17 are configured to serve only as a Master Device 31, such as Boundary Device 29 for subnetwork 13. In this regard, subnetwork 13 is configured with only one Boundary Device 17 as a Master Device 31, whereas subnetwork 12 is equipped with three Boundary Devices 17—one of which serving as a Master Device 31 and the other two reporting to other Boundary Devices 17.

It is important to note that, as previously discussed; a Master Device 31 need not have a corresponding Slave Device 32. Likewise, each Master Device 31 need not store or simulate the corresponding subnetwork hydraulic model 56, but may further communicate with an additional processing unit.

Figure 5:
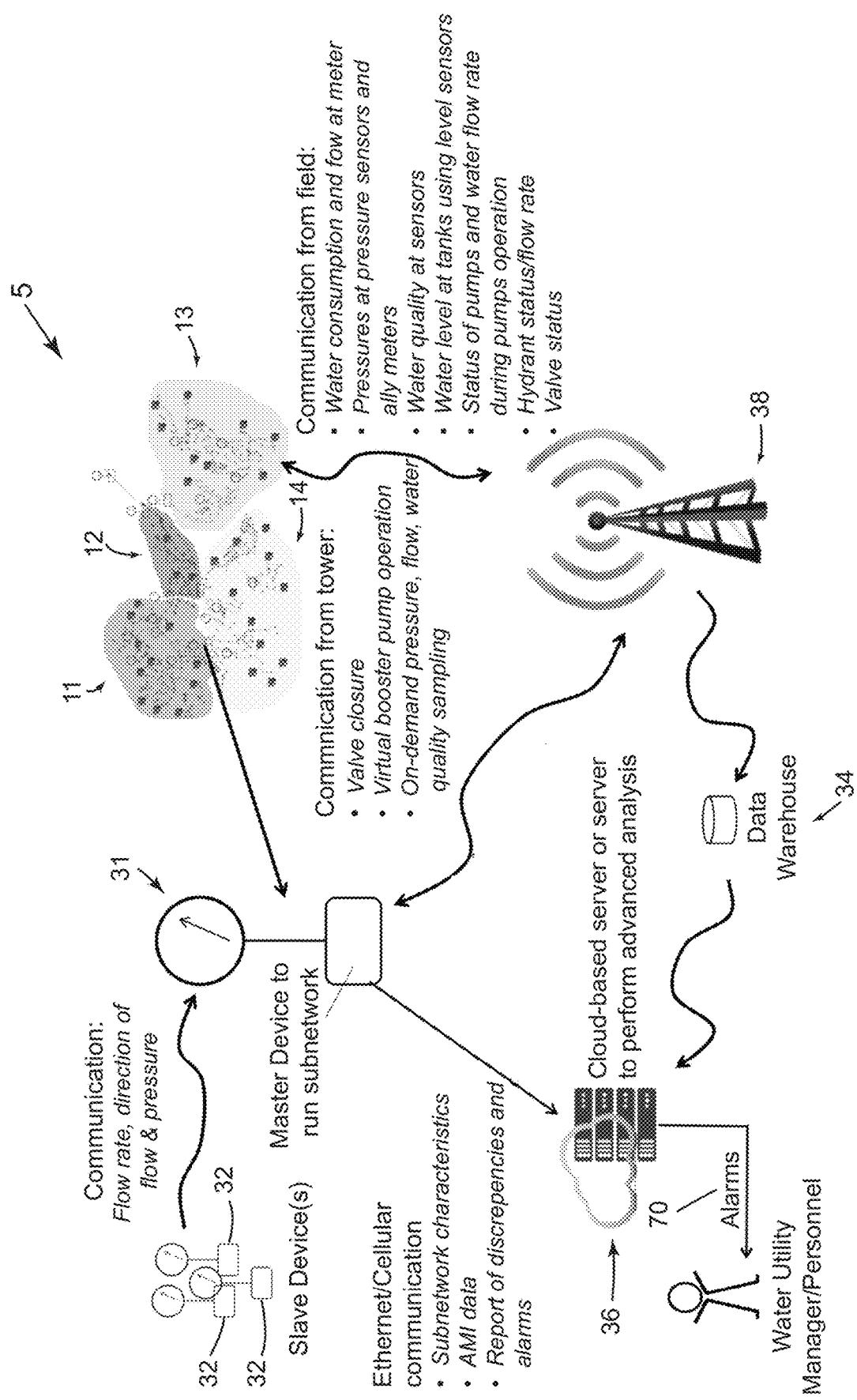
FIG. 5 depicts one embodiment of communication and information flow in accordance with the present disclosure.

FIG. 5 shows an exemplary configuration for communication in one embodiment of the presently disclosed system. This communication may include information relating to flow rate, the direction of flow, pressure, water quality, and other information beneficial to the management of the subnetworks 11-14 as provided herein. Upon the initial setup and installation of the presently disclosed systems and methods, the location of each Master Device 31 is assigned a Server 36. The Server 36 reads the network hydraulic model as previously discussed and strategically creates a subnetwork hydraulic model 56 for each subnetwork 11-14. Each Master Device 31 receives at least one subnetwork hydraulic model 56 corresponding to the associated subnetwork or subnetworks a firmware. At least one subnetwork hydraulic model 56 is embedded as subnetwork hydraulic model metadata, which is used by the firmware and software to run the subnetwork hydraulic model 56. The firmware subnetwork hydraulic model metadata contains the location of distribution pipes 6, pipe intersections, tanks, valves, devices, and any sensors installed in the subnetwork. The firmware metadata also contains the pipe roughness coefficients, the relative and absolute elevation of each node 8 subnetwork and all meters, and other hydraulic parameters for subnetwork hydraulic modeling simulation, such as read interval. The Server 36 also assigns any Slave Device 32 within the subnetwork to the corresponding Master Device 31. The subnetwork hydraulic model 56 simulation is performed by the Master Device 31 as previously described. Communication to and from the Master Device 31, each Slave device 32, and other components may be wireless, such as through cellular communication, or wired.

The Master Device 31 simulates the current and future behavior of the subnetwork at every defined time step. It is achieved locally, independently, and at a fraction of the computation and time needed to have a similar subnetwork hydraulic model 56 simulated as part an entire network hydraulic model simulation by a central processing unit. The presently disclosed systems and methods are applicable for normal operation, planning, testing, and handling emergency conditions. The systems and methods detect unusual behavior in some part of or entire subnetwork to identify and communicate anomalies and discrepancies to the Server 36. They may also deploy what-if scenario analysis or be set in an emergency mode, for example by the Server 36, to provide a higher-resolution image of the field for advance analysis such as modeling a segment of a pipe using the Lagrangian approach to Transient Flow Analysis.

The Master Device 31 is configured to perform at least one of a series of static hydraulic modeling using the Bernouli Equation and to execute a transient flow analysis by separating a piece of pipe from a network and perform detailed Transient Flow Analysis on it to identify the cause of anomaly. The detailed Transient analysis is triggered once the Master Device 31 identifies an anomaly in Pipe 73 (FIG. 7). The Master Device 31 locates a set of Pressure Sensor 71 (FIG. 7) that can isolate the Pipe 73 and a set of Meters 72, which are surrounded by Pressure Sensor 71. The Transient Analysis is performed on Pipe 73 to identify the cause of anomaly, such as a burst due to an occurrence of a leakage.

In one embodiment of the present disclosure, the subnetwork hydraulic model 56 is simulated to analyze a subnetwork using the following equations.

Determining Pressures and Flows in a Single Pipe

The hydraulic head is calculated for a given point in a distribution pipe 6 within the distribution network 5 using Bernoulli's Equation as follows:

$$H_a = \frac{p_a}{\gamma} + \frac{v_a^2}{2g} + h_a \qquad \text{Eqn. 1}$$

where $H_a$ is the value of hydraulic head at the point a, $p_a$ is the water pressure, $v_a$ is the water velocity, and $h_a$ is the elevation of a first point a. $\gamma$ is the water specific weight.

The pressure and flow at another point in the distribution pipe 6, such as second point b, can be calculated by considering the headloss between these points.

$$\frac{p_a}{\gamma} + \frac{v_a^2}{2g} + h_a = h_{loss} + \frac{p_b}{\gamma} + \frac{v_b^2}{2g} + h_b \qquad \text{Eqn 2}$$

The headloss is a function of the property of pipe and the water velocity. The headloss can be calculated using empirical equations such as Darcy-Weisbach, Hazen-Williams, or Manning equations.

For a loop in a distribution network 5, Eqn. 3 can be used to derive a set of equations based on the conservation of energy of a fluid. The law of conservation of energy states that the energy (kinetic and potential) of an isolated system is path independent. This means that the headloss along any path from the entrance to the exit of the loop are equal.

A distribution network 5 or one of the subnetworks 11-14 can be modeled as a graph with n junction nodes and $n_f$ node with fixed grade, which includes tanks, reservoirs, and in some situations one or more of the Boundary Devices 17. Each node 8 that has one or more Boundary Devices 17 (either Master Device 31 or Slave Device 32) is treated in the subnetwork modeling differently from the typical hydraulic modeling. If distribution pipe 6 $p_{ij}$ connects node i to node j, the headloss in the distribution pipe 6 $p_{ij}$ is as follows:

$$H_{it} - H_{jt} = h_{ijt} = rQ_{ijt}^{\alpha} + mQ_{ijt}^2 \qquad \text{Eqn. 3:}$$

where H=nodal head, h is headloss, r=distribution pipe 6 resistance, Q is flow rate, a is flow exponent, m is minor loss coefficient, and t is time of simulation. Darcy-Weisbach and Hazen-Williams equations are used to compute the pipe resistance values (r).

The head of pumps can be calculated by a power law of the form:

$$h_{ijt} = -w^2(h_0 - r(Q_{ijt}/\omega)^\beta) \qquad \text{Eqn. 4:}$$

where $h_0$ is the shutoff head for the pump, $\omega$ is a relative speed setting, and r and $\beta$ are the pump curve coefficients.

Analyzing Pressures and Flows in Distribution Networks

Figure 4:
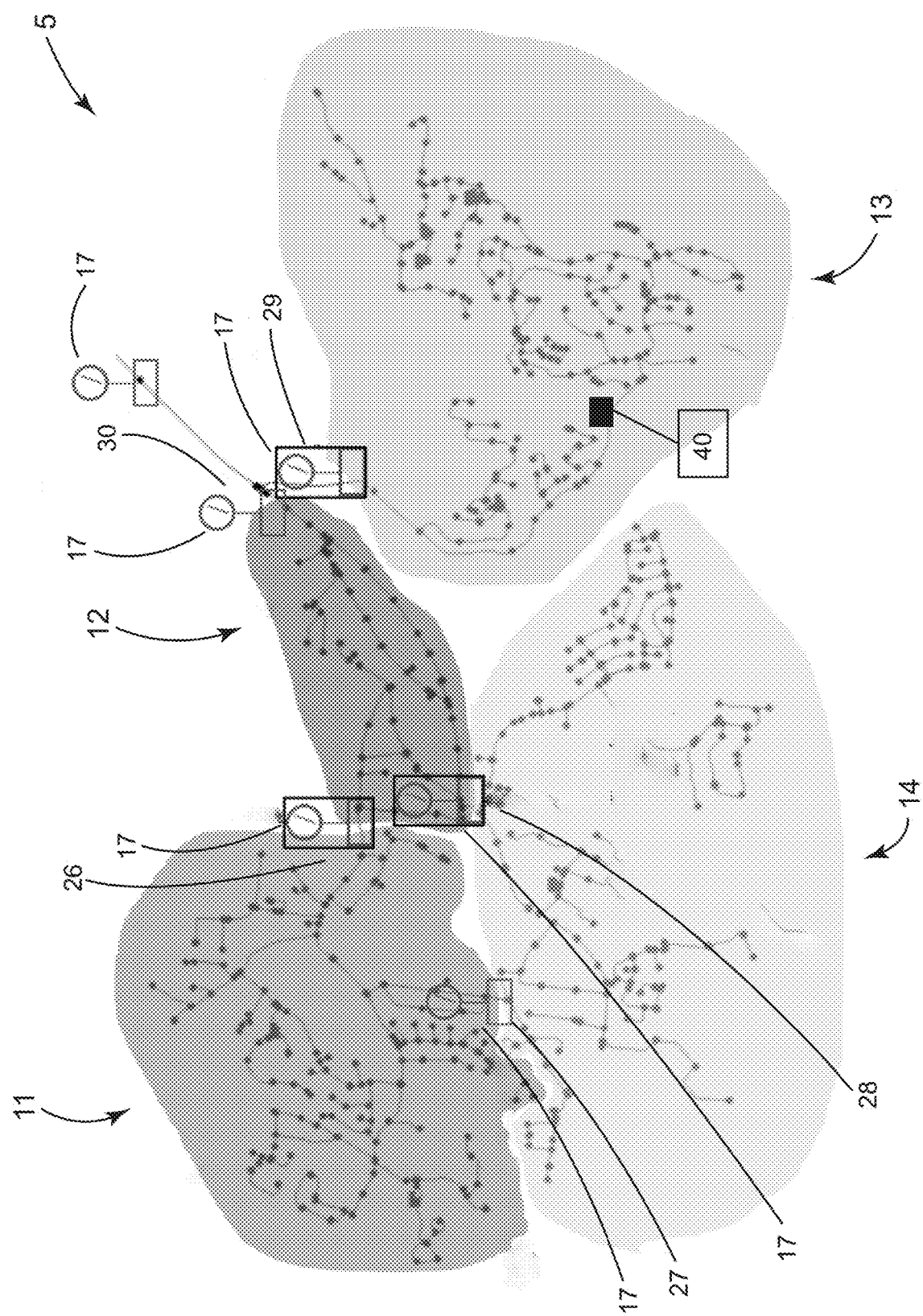
FIG. 4 depicts another embodiment of the systems and methods of the present disclosure.

A water distribution subnetwork consists of a set of elements such as tanks, distribution pipes 6, pumps, and booster pumps 40 (as shown in FIG. 4) to deliver water to households, commercial, and industrial places as previously discussed. To model a subnetwork, the fundamental equations are formulated to describe the subnetwork components. These equations describe the subnetwork, elevation of components, size of distribution pipe 6, type of distribution pipe 6, type and size of tanks and pumps, and some approximated values for distribution pipe 6 roughness and water demands. These data are stored as a firmware metadata in each Master Device 31 associated with one of the subnetworks 11-14. However, as previously discussed, the presently disclosed systems and methods do not require the designation of Boundary Devices 17 as being a Master Device 31 or a Slave Device 32. For example, a processing unit may be assigned to a given subnetwork in place of handling the computations with a Boundary Device 17 acting as a Master Device 31.

The aggregation demands at a node 8 can be determined using fundamental equations previously disclosed in U.S. patent application Ser. Nos. 15/226,597 and 15/402,743. Using these fundamental equations, analytical methodologies (such as described by Todini and Pilati (1988; Salgado et al. (1988)) can be used to find the pressures and flows for every component of the subnetwork.

In the present disclosure, the virtual head and virtual demand are also calculated at a defined time interval for each node 8 at which the Boundary Devices 17 are located. An extended time period analysis aims to use these sets of fundamental equations to find flows and pressures for a predefined time period and set demands. In real-time subnetwork hydraulic model 56 simulation, the simulation is performed on at least an hourly basis and ideally runs throughout the life of the distribution network 5.

In the following equations, t denotes time for the simulation, which represents an hour of a day, e.g. 1:00 pm on Jan. 1, 2016. The incremental time may be set arbitrarily, but typically will not exceed one hour to ensure high resolution datasets for the subnetworks 11-14.

In the subnetwork hydraulic model 56 simulations, each of the Boundary Devices 17 at a node 8 have two statuses. For both statuses, the direction of flow is determined based on the position of a given subnetwork with respect to the Device. Inflow direction means water is entering the subnetwork and outflow direction means water is exiting the subnetwork. First, the node 8 is modeled as a sink node when water leaves the subnetwork as outflow. The sink node is essentially a node 8 that has demand outside the given subnetwork. Since another subnetwork exists on the downstream of this sink node, the virtual demand takes into account the demands in the downstream subnetwork or subnetworks 11-14. In the second status, the node 8 is a source, whereby water enters the subnetwork in the direction nominally called inflow. The node 8 is modeled with a fixed head at a given time of simulation, which will be discussed further below.

Eqn. 5 is the second set of equations that are based on the conservation of mass. The law of conservation of mass states that mass can neither be created nor destroyed. Eqn. 5 satisfies the flow continuity through all nodes.

$$\sum_j Q_{ijt} - D_{it} = 0, \quad i = 1, \ldots, n \qquad \text{Eqn. 5}$$

where $D_i$ is the flow demand at node i. As index i represents a location in a subnetwork, therefore $D_i$ is the demand that is extracted from a water subnetwork. The $D_i$'s are calculated for each node 8 based on the location of meters in the subnetwork and the connection of each meter to the subnetwork. The calculation of $D_i$'s is explained further below. T should be noted that meters throughout this disclosure when not otherwise specified include consumption meters 18, pressure sensors 16, Boundary Devices 17 and the flow meter 42, pressure sensor 44, and optional water quality sensor 46 contained therein, ally meters 19, and any other sensor or meter within the distribution network 5.

Integration of AMI Data to Distribution Network Equations

As previously discussed, the real-time dynamic simulation of the subnetwork hydraulic models 56 of the distribution network 5 may solve for flows and pressures for an infinite number of time steps. As such, the equations previously provided are solved repeatedly. The flows and pressures at each time step are used as initial boundary conditions for the next time interval.

At each time step of the simulation (time step $t_s$) in one embodiment, the consumptions are extracted from an Advanced Metering Infrastructure (AMI) data warehouse 34 and transmitted to the Server 36. The algorithm maps each node 8 (represented with index i in Eqn. 5) to meters based on their locations and aggregates the consumption values to find the demand at every node 8 for the given time step. The mapping can be done computationally through some computer apparatus or using the field data, expressing the connectivity of a meter to the subnetwork. The result of this step updates $D_i t$ in Eqn. 5 where $t=t_s$. The algorithm checks the list of all consumption meters 18 to include and exclude the corresponding consumption at any time a consumption meter 18 is added to or removed from the distribution network 5.

Calculating Virtual Demand

If the flow is outbound or outflow from a given subnetwork, the virtual demand is calculated. The virtual demand is a value that is calculated for each of the Boundary Devices 17 at a time t of the simulation. The virtual demand represents the volume of water that was consumed at the downstream subnetworks during the last interval δT. The interval is the time between previous time step of simulation to the current time. The flow rate is aggregated (integrated) within the interval and assigned as the virtual demands to the node 8.

Figure 6:
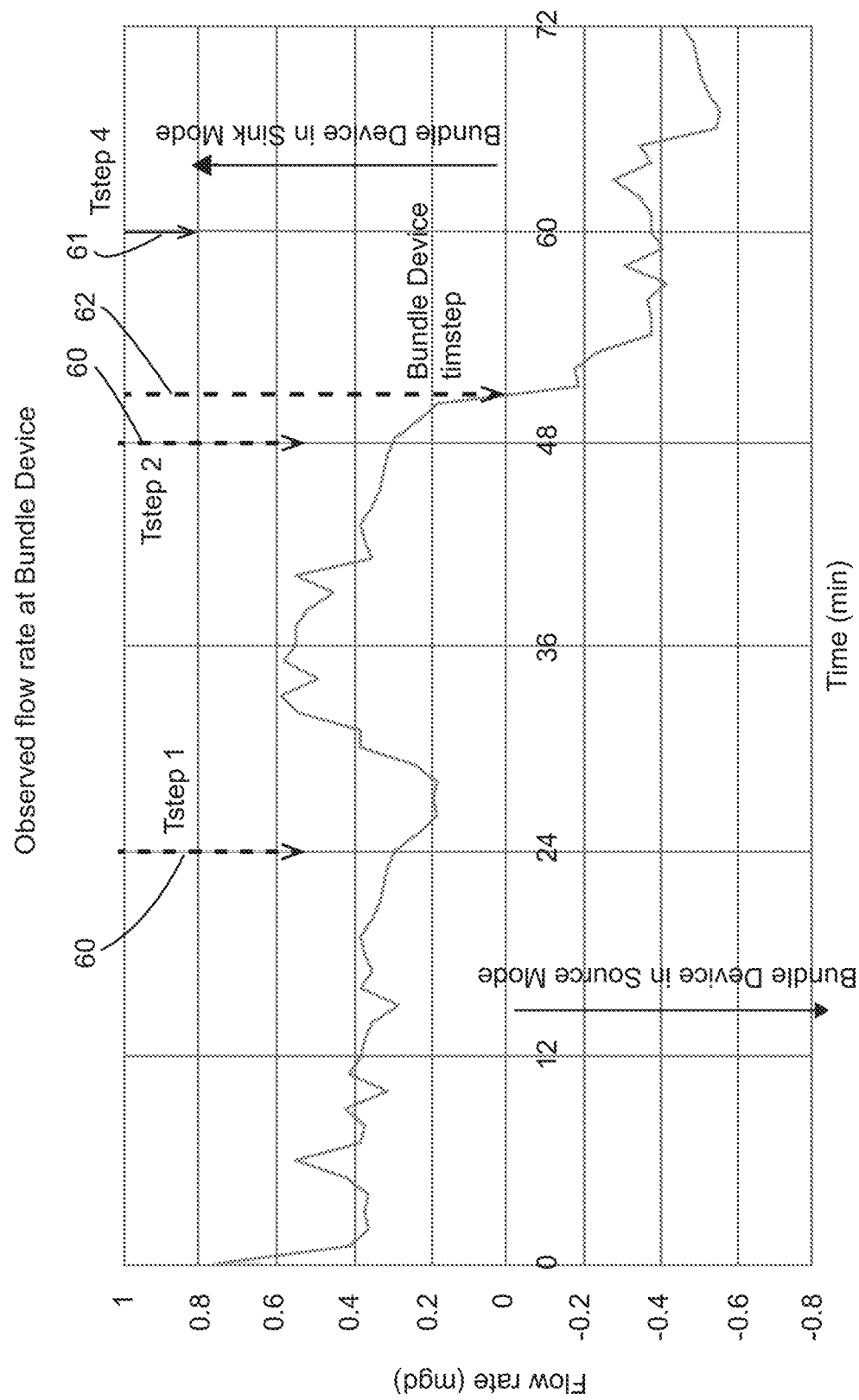
FIG. 6 exemplifies the determination of a calculation in accordance with the present disclosure

FIG. 6 shows exemplary flow data as read at one of the Boundary Devices 17. This also demonstrates how virtual demand is calculated. The Boundary Devices 17 are each modeled in two ways; sink and source modes as previously introduced. In the sink mode, the flow rate is translated as a demand, as previously described. The time steps of simulation are shown as the dashed line 60. The dark solid line 61 is the time at which a user sent a request to receive results (i.e. flows and pressures at the subnetwork). The time step line shown as 62 represents the time determined by the Boundary Devices 17 to run the subnetwork hydraulic model 56 for the given subnetwork on the Master Device 31.

In the traditional hydraulic model, the amount of water that is passed through each of the Boundary Devices 17 is calculated and assigned as the demand for the node 8 at which that one of the Boundary Devices 17 is installed. In this traditional approach, it is assumed that the demand is uniformly distributed across all time steps. However, in the presently disclosed systems and methods, the Master Device 31 reads the data at each time step and calculates the demand for the previous period using the subnetwork hydraulic model 56. For example, for time step, the device calculates the demand by finding the area underneath the curve from Tstep1 to Tstep2 as shown in FIG. 6. In one embodiment, the Master Device 31 is configured to automatically run the subnetwork hydraulic model whenever the boundary condition of the given subnetwork changes from sink mode to source mode, or vice versa. The subnetwork hydraulic model is then updated based on the data sent to the Master Device 31 during that time interval.

Calculating Virtual Head

If the flow is inbound or inflow with respect to the subnetwork, a fixed head is calculated using Eqn. 1. For a given time, the flow rate is used to calculate the flow velocity (knowing the diameter of the distribution pipe 6 from the original network-wide hydraulic model and later, updated subnetwork hydraulic model 56), the pressure is obtained from the field on-demand. Knowing the elevation of each of the Boundary Devices 17, the head is calculated for the time period, using Eqn. 1. The parameters of this equation are characterized by the measurement of either the Master Device or the Slave Device. The resulting head is assigned to the equations of subnetwork hydraulic model 56 simulations. In the case that data is collected more frequently than the length of the time step, an average of the calculated heads is used.

The present inventors have identified many applications for employing the presently disclosed systems and methods. Some examples include leak detection, theft detection, water quality analysis, and backflow. In one embodiment, when low water quality is detected at one of the Boundary Devices 17 or another server, the Master Device 31 closes valves that are located on the same distribution pipe 6 in which the Master Device 31 is located, isolating that subnetwork. This includes closing boundary values 9, or other values along the distribution pipe 6.

In addition, to identify the location of a leak, the Master Device 31 can schedule a booster pump 40 (shown in FIG. 4) to operate to increase the pressure signature in the subnetwork. These booster pumps 40 are effectively pumps that can be operated during the normal hours. These pumps are not required for normal operation of pumps. The locations for installing these booster pumps 40 are determined by analysis performed in the Server 36. Specifically, these locations may be chosen to provide the greatest impact on pressure within a subnetwork, according to a simulation of the subnetwork hydraulic model 56. Similarly, a crew may deploy mobile booster pumps 40 during an emergency situation to provide further data for a more detailed analysis.

The concept behind this procedure and analysis is to boost the pressure in the subnetwork such that the performance of the subnetwork is altered. After the booster pumps are placed into operation, any pressure sensors 16 or the pressure sensors within each Master Device 31 and Slave Device 32 provide different, new pressures readings and the regime of water movement changes. The Master Device 31 re-simulates the subnetwork hydraulic model 56 using this additional pressure information, including information received from the booster pump 40, such as the flow or pressure introduced. Creating this new subnetwork hydraulic behavior using the booster pumps 40, then conducting analysis of the subnetwork hydraulic model 56, enables the Master Device 31 to detect the cause of an anomaly with higher precision. It should be known that other components may also be controlled to also assist in identifying such anomalies, including select shutoff of valves.

In one embodiment, the utilities use the subnetwork hydraulic model 56 for planning and executing hydrant flushing and power management. Specifically, the Master Device 31 simulates which hydrants to be opened and predicts the direction of the flow in each distribution pipe 6. In another embodiment, the Master Device 31, by simulating the subnetwork hydraulic model 56, controls valves to ensure that the flow velocity stays at 2 feet per second (fps) in targeted distribution pipes 6 for cleaning and flushing purposes. This operation is critical as the complex network of distribution pipes 6 and storage reservoirs (such as the water tower 10 shown in FIG. 1) are often affected by sediment or deposits that naturally accumulate over time. If not removed, these materials may cause water quality deterioration, taste and odor problems, or discoloration of the water. Water may also stagnate in lesser used parts of the distribution network 5. This can result in degraded water quality.

As previously discussed, the presently disclosed systems and methods are also useful for leak detection. For leak detection, a mass balance can be used to find if water is wasted, not metered or billed. The following equation is an expansion to the mass balance equation, which includes tank water fluctuation (using Smart Gateway device or RTM at each tank to sense level of water), hydrant operations (again using Smart Gateway or RTM device with a mobile meter to measure the amount of water that is flushed), and AMI.

$$\sum_{i=1}^{n} \sum_{j=1}^{T_{invl}} F_{MSM,i,j} \times \delta T_j - \sum_{t=1}^{tankNb} \omega_{filled,t} + \sum_{t=1}^{tankNb} \omega_{depleted,t} + \sum_{k=1}^{hydrantNb} \omega_{lost,k} = \sum_{m=1}^{meterNb} \sum_{j=1}^{T_{invl}} D_{m,j} \qquad \text{Eqn. 6}$$

where n is the total number of Master Devices 31 and Slave Devices 32 in the subnetwork, $F_{(MSM,i,j)}$ is the average flow rate registered at the $i^{th}$ Master Device 31 during the time step $j^{th}$ (or the $j^{th}$ interval). The $\delta T_j$ is the interval between two readings, the $\omega_{(filled,t)}$ is the total volume of water that is stored in the $t^{th}$ tank and respectively the $\omega_{(depleted,t)}$ is the total volume of water that is depleted from the $t^{th}$ tank. The time duration for tank raising and lowering is completely dependent on the performance of the network and pump operation. The $\omega_{(lost,k)}$ is the volume of water that is lost through hydrants if they are used. The variable $D_{(m,j)}$ is the demand at the $m^{th}$ consumption meter 18 during the interval.

The Master Device 31 uses Eqn. 6 to ensure the amount of water produced is equal to the amount of water that is consumed at consumption meters 18. The subnetwork hydraulic model 56 includes the number and locations of the consumption meters 18 within the given subnetwork. In one embodiment, this information is provided to each Master Device 31 by a Server 36 that is Cloud-based. The Server 36 then adds any consumption meters 18 to the subnetwork hydraulic model 56 as new consumption meters 18 are deployed in the field.

The pressure sensors 16 within the subnetwork are also used to identify leaks. The pressure obtained from a pressure sensor 16 is compared with the pressure that is simulated by Master Device 31 device. When this pressure difference exceeds a threshold, the Master Device 31 sends a notification to the Server 36 for detailed exploration on the cause and the location of a leak. The Server 36 also informs the utility about the potential location of leaks.

If the pressure differences previously discussed grow gradually over time, such as over many months, the Master Device 31 submits a request to the Server 36 for a distribution pipe 6 roughness calibration in accordance with U.S. patent application Ser. No. 15/226,597. The new information and distribution pipe 6 roughness coefficients are sent back from the Server 36 to the Master Device 31 to update the subnetwork hydraulic model in the Master Device 31 firmware.

In another embodiment, the system includes an alarm 70 (shown in FIG. 5) to indicate an unexpected or unintended backflow detected by the Boundary Devices 17 or another meter. If a backflow is detected, the Master Device 31 simulates the water quality by considering the location of this Boundary Device 17 or the meter as the source of low water quality or contamination. The Master Device 31 informs utility about the affected area for water quality sampling.

The presently disclosed systems and methods further provide for enhanced step tests within a subnetwork without causing an interruption in service to the consumers. The pressure in the subnetwork can be augmented using booster pumps 40, as previously discussed. This is referred to as an augmented pressure because this pressure augmentation is not necessary for delivering water to consumers and is added for testing purposes, such as leak identification. These booster pumps 40 do not typically run during the normal operation of the network. The booster pumps 40 can be operated to augment the pressure in some portion of or an entire subnetwork, which can be separated from other subnetworks 11-14 by boundary valves 9. In one embodiment, one of the boundary valves 9 is installed at the Master Device 31 location. In some circumstances, closing one or more boundary valves 9 significantly disturbs the subnetwork performance, which creates new water movement pattern in the subnetwork. Typically, water enters the subnetwork by way of a Master Device 31 or Slave Device 32. However, using the booster pumps 40 or closure of boundary valves 9, the direction of water can be reversed, providing new information to be processed using the subnetwork hydraulic model 56.

In the absence of above booster pumps 40, the Master Device 31 can also use standard operation pumps and non-boundary valves to change the pressure patterns in the network or a specific subnetwork. For example, running a pump at higher rate or changing the setting of a valve, can change the pressure patterns in a subnetwork. By modeling the same events, the Master Device 31 can compare the simulated pressure pattern with the observed pressure to conduct such analysis as leak detection.

In some embodiments, the presently disclosed systems and methods also provide information regarding the effectiveness of flushing operations after being completed. Historic data collected from all measurement devices within the distribution networks can be sent to the Server 36. The Master Device 31 evaluates the data to determine the performance of the flushing program and to determine when the next flush is needed. This involves the Master Device 31 simulating the flow speed in distribution pipes 6 that are being flushed. If a distribution pipe 6 is not flushed properly, the Master Device 31 sends the proper message to a utility manager. If water quality sensors are installed in the subnetwork, the concentration of water quality or a proxy that represents the water quality, can be also measured to be compared with simulated values. In this manner, the utility can estimate and understand the effectiveness of their flushing program.

According to another embodiment, the presently disclosed systems and methods are used to assist with meeting minimum pressure requirement in the entirety a network by controlling the pressure at the arterial main supply that feeds water to a plurality of its subnetworks. Typically, pressure management is based on DMAs, and thus suffers from the aforementioned limitations and issues associated with DMAs. In one embodiment, the Master Device 31 is located at a main supply outlet of a main supply station with a pump station feeding water to a plurality of subnetworks each equipped with a Slave Device 32 and a critical node with a pressure sensor 16. The critical node could be a node 8 with lowest pressure in the subnetwork, which could be the farthest and/or highest node in the subnetwork. The Master Device 31 and Slave Device 32 ensemble simulate the pressure distribution for a present or projected condition characterized by supply flowrate, endpoint demands, time, or other measures given a variable virtual head at the main supply flow outlet, which is virtually segregated from the pump station. The Master Device 31 then finds a virtual head setting at the main supply flow outlet that maintains a minimum downstream pressure requirement at a plurality of critical points distributed in the plurality of subnetworks. The pump station operation is then accordingly tuned such that it sustains this current main outlet pressure target value set by the Master Device 31. In one embodiment, the distribution network is managed such that the pressure sensed by the Master Device 31 is at least a minimum upstream pressure that corresponds to each Slave Device 32 sensing a pressure of at least the minimum downstream pressure required. Collectively, this practice meets pressure requirements in the plurality of subnetworks while reducing pumping energy consumption. It also decreases background water loss and pipe breaks across the network, as leakage and bursts are driven by pressure. In other words, the presently disclosed systems and methods enable the utility to avoid providing excess pressure, minimizing leakage and the likelihood of bursts.

Deciding Time to Run Hydraulic Model for Each Subnetwork

In certain embodiments, the times at which one complete hydraulic model is simulated is the minimum of the predefined time step (i.e. 1 hour) and each subnetwork model is simulated at one of the times dictated by the following rules. These times are different across subnetworks 11-14. It is preferable that the subnetwork 11-14 and its corresponding subnetwork hydraulic model 56 contains every components that exists in a water network distribution, such as pipes, valves, tanks, and pumps.

Rule 1: Smart Gateway or any communication devices attached to any valve senses that the status of valve is changed. Pump statuses include when the pump becomes open, closed, or has a setting or position changed.

Rule 2: At least one of the Master Device 31 and the Slave Device 32 senses a change in the direction of flow, leaving or entering the subnetwork.

Rule 3: The time at which the water tank level starts raising or decreasing.

Rule 4: Smart Gateway or any communication devices attached to any pump senses that the status of pump is changed. Pump statuses include when the pump becomes open, closed, or has a setting or position changed.

In the above description, certain terms have been used for brevity, clarity, and understanding. No unnecessary limitations are to be inferred therefrom beyond the requirement of the prior art because such terms are used for descriptive purposes and are intended to be broadly construed. The different assemblies described herein may be used alone or in combination with other devices. It is to be expected that various equivalents, alternatives and modifications are possible within the scope of any appended claims.

We claim:

1. A system for managing a distribution network, the system including a network hydraulic model and an automated meter infrastructure (AMI) that provides an AMI data from a plurality of consumption meters, the system comprising:
    a plurality of subnetworks within the distribution network;
    a plurality of nodes that interconnect the plurality of subnetworks;
    a plurality of boundary devices, each boundary device from the plurality of boundary devices being operatively connected to a node from the plurality of nodes, wherein each boundary device from the plurality of boundary devices at least includes a flow meter and a pressure sensor, and wherein the flow meter senses a flow and the pressure sensor senses a pressure such that the plurality of boundary devices sense the flow and the pressure of the distribution network at the plurality of nodes at a given time step;
    a plurality of subnetwork hydraulic models generated from the network hydraulic model, wherein the plurality of subnetwork hydraulic models correspond to the plurality of subnetworks; and
    processsing modules each configured to determine a first comparison for the given time step between the AMI data from the plurality of consumption meters within corresponding given subnetworks, the flow and the pressure at the plurality of nodes that border the corresponding given subnetworks, and the subnetwork hydraulic models for the corresponding given subnetworks, wherein the distribution network is managed based at least in part on the first comparison.

2. The system according to claim 1, wherein the processing modules are each further configured to identify an anomaly between the subnetwork hydraulic models and the AMI data from the plurality of consumption meters within the corresponding given subnetworks and the flow and pressure sensed at the plurality of nodes that border the corresponding given subnetworks.

3. The system according to claim 1, wherein the processing modules are each further configured to update the subnetwork hydraulic models based on at least one of the AMI data from the plurality of consumption meters within the corresponding given subnetworks or the flow or the pressure sensed at the plurality of nodes bordering the corresponding given subnetworks.

4. The system according to claim 3, wherein an interval is formed between times at the given time step, and wherein the subnetwork hydraulic models are each updated only for the interval.

5. The system according to claim 1, wherein the plurality of boundary devices each include a first boundary device and a second boundary device that each border the corresponding given subnetwork, wherein the first boundary device is a master device and the second boundary device is a slave device, wherein the master device includes one of the processing modules, and wherein the slave device communicates the flow and the pressure sensed by the slave device to the master device.

6. The system according to claim 1, wherein the processing modules are each further configured to control a component within the distribution network such that a disturbance is created within the corresponding given subnetwork, to monitor an impact of the disturbance using the flow or the pressure sensed by the plurality of boundary devices that border the corresponding given subnetwork, to identify an anomaly between the impact of the disturbance and the subnetwork hydraulic models for the corresponding given subnetworks, and to update the subnetwork hydraulic models based on the anomaly identified between the impact of the disturbance and the subnetwork hydraulic models.

7. The system according to claim 6, wherein the component for one of the given subnetworks is a booster pump and operation of the booster pump causes the disturbance.

8. The system according to claim 1, wherein at least one boundary device of the plurality of boundary devices for one of the given subnetworks further includes a water quality sensor.

9. The system according to claim 1, wherein the flow sensed by a boundary device of the plurality of boundary devices has a first direction during a first time and a second direction during a second time, and wherein the processing modules are further configured to update the subnetwork hydraulic models when the first direction is opposite of the second direction.

10. A method for managing a distribution network, the method incorporating a network hydraulic model and an automated meter infrastructure (AMI) that provides an AMI data from a plurality of consumption meters, the method comprising:
dividing the distribution network into two or more subnetworks;
interconnecting the plurality of subnetworks at a plurality of nodes;
providing a plurality of boundary devices, wherein each boundary device within the plurality of boundary devices at least includes a flow meter and a pressure sensor, and wherein the flow meter is configured to sense a flow and the pressure sensor is configured to sense a pressure of the distribution network at the plurality of nodes;
operatively connecting each boundary device from the plurality of boundary devices to a node from the plurality of nodes;
generating from the network hydraulic model two or more subnetwork hydraulic models that correspond to the two or more subnetworks;
sensing at a given time step by the plurality of boundary devices the flow and the pressure of the distribution network at each node of the plurality of nodes, wherein an interval is formed between times at the given time step; and
determining a comparison for the interval between the AMI data from the plurality of consumption meters within a given subnetwork, the flow and the pressure sensed at the plurality of nodes that border the given subnetwork, and the subnetwork hydraulic model for the given subnetwork; and
managing the distribution network based at least in part on the comparison.

11. The method according to claim 10, wherein the given time interval is one hour.

12. The method according to claim 10, further comprising identifying an anomaly between the subnetwork hydraulic model and the AMI data from the plurality of consumption meters within the given subnetwork and the flow and the pressure sensed at the plurality of nodes bordering the given subnetwork.

13. The method according to claim 10, further comprising updating the subnetwork hydraulic model based on the AMI data from the plurality of consumption meters within the given subnetwork or the flow and or the pressure sensed at the plurality of nodes bordering the given subnetwork.

14. The method according to claim 13, wherein the subnetwork hydraulic model is updated only for the interval.

15. The method according to claim 10, wherein the plurality of boundary devices includes a first boundary device and a second boundary device that each border the given subnetwork, wherein the first boundary device is a master device and the second boundary device is a slave device, wherein the master device include a processing unit that runs the subnetwork hydraulic model, and wherein the slave device communicates the flow and the pressure sensed by the slave device to the master device.

16. The method according to claim 15, further comprising providing a plurality of slave devices corresponding to the two or more subnetworks, further comprising determining a minimum upstream pressure sensed at the master device such that the pressure sensed at each of the plurality of slave devices is at least a minimum downstream pressure, and further comprising managing the distribution network such that the pressure sensed by the master device is at least the minimum upstream pressure.

17. The method according to claim 10, wherein the distribution network a component, further comprising controlling the component to generate a disturbance within the given subnetwork, monitoring an impact of the disturbance using the flow or the pressure sensed by the plurality of boundary devices that border the given subnetwork, identifying an anomaly between the impact of the disturbance and the subnetwork hydraulic model for the given subnetwork, and updating the subnetwork hydraulic model based on the anomaly identified between the impact of the disturbance and the subnetwork hydraulic model.

18. The method according to claim 10, wherein a boundary device of the plurality of boundary devices further includes a water quality sensor.

19. The method according to claim 10, wherein the flow sensed by a boundary device of the plurality of boundary devices has a first direction during a first time and a second direction during a second time, further comprising that the subnetwork hydraulic model is updated when the first direction is opposite of the second direction.

20. A system for managing a distribution network, the system incorporating a network hydraulic model and an automated meter infrastructure (AMI) that provides an AMI data from a plurality of consumption meters, the system comprising:
a first subnetwork within the distribution network;
a second subnetwork within the distribution network;
a node that operatively connects the first subnetwork and the second subnetwork;
a boundary device that is operatively connected to the node, wherein the boundary device includes a flow meter that senses a flow and a pressure sensor that senses a pressure of the distribution network at the node;
a first subnetwork hydraulic model corresponding to the first subnetwork;
a second subnetwork hydraulic model corresponding to the second subnetwork; and a processing module configured to compare at least the AMI data from the plurality of consumption meters within the first subnetwork, the flow and the pressure sensed at the node, and the first subnetwork hydraulic model to identify an anomaly between the first subnetwork hydraulic model and the AMI data from the plurality of consumption meters, the flow sensed at the node, and/or the pressure sensed at the node.

* * * * *